United States Patent
Rachkov et al.

(10) Patent No.: US 6,681,481 B1
(45) Date of Patent: Jan. 27, 2004

(54) MICRODEVICE FEEDER TO ASSEMBLY LINE HOLDING CONNECTOR SYSTEM

(75) Inventors: Rossen Atanassov Rachkov, Monroe, WA (US); Bryan David Powell, Maple Valley, VA (US); Robert B. Hubler, Seattle, WA (US)

(73) Assignee: Data I/O Corporation, Redmond, WA (US)

( * ) Notice: Subject to any disclaimer, the term of this patent is extended or adjusted under 35 U.S.C. 154(b) by 202 days.

(21) Appl. No.: 09/948,415

(22) Filed: Sep. 6, 2001

(51) Int. Cl.$^7$ ................................................ B23P 21/00
(52) U.S. Cl. ........................... 29/784; 29/760; 403/381; 403/353; 403/316
(58) Field of Search ................................ 403/381, 363, 403/353, 317, 316; 29/760, 784, 799, 824, 740

(56) References Cited

U.S. PATENT DOCUMENTS

| | | | |
|---|---|---|---|
| 5,598,986 A | * | 2/1997 | Ando et al. ............... 242/597.6 |
| 6,315,182 B1 | * | 11/2001 | Chen ........................... 224/420 |
| 6,340,266 B1 | * | 1/2002 | Bolotin et al. .............. 403/373 |
| 6,364,184 B1 | * | 4/2002 | Hauck et al. ............... 224/271 |

FOREIGN PATENT DOCUMENTS

| | | | |
|---|---|---|---|
| JP | 410229295 A | * | 8/1998 |
| JP | 10247797 A | * | 9/1998 |

OTHER PUBLICATIONS

U.S. patent application Ser. No. 09/418,732, filed Oct. 13, 2001.

* cited by examiner

*Primary Examiner*—Gregory Vidovich
*Assistant Examiner*—Jermie E. Cozart
(74) *Attorney, Agent, or Firm*—Mikio Ishimaru

(57) ABSTRACT

A holding connector system is provided for connecting a microdevice feeder to an assembly line table having a plurality of latch stop pins and a plurality of alignment slots. A connector body having a guide rail, which is pivotally mounted to the first structure, engages one of the plurality of alignment slots for connecting the microdevice feeder and the assembly line table. A holding mechanism having a latch, which is pivotally mounted to the microdevice feeder engages one of the plurality of latch stop pins for holding the microdevice feeder to the assembly line table. The holding connector system allows for simple, easy installation and removal of the microdevice feeder without the possibility of front to back tipping.

11 Claims, 3 Drawing Sheets

MICRODEVICE FEEDER TO ASSEMBLY LINE HOLDING CONNECTOR SYSTEM

CROSS-REFERENCE TO RELATED APPLICATION

The present application contains subject matter related to a co-pending U.S. Patent Application by Lev M. Bolotin entitled "MANUFACTURING SYSTEM WITH FEEDER/PROGRAMMING/BUFFER SYSTEM". The related application is assigned to Data I/O Corporation, is identified by Ser. No. 09/418,732, now U.S. Pat. No. 6,532,395 B1, and is hereby incorporated by reference.

TECHNICAL FIELD

The present invention relates generally to a connector system for connecting two systems and more particularly to a connector system for connecting an electronic microdevice feeder to an electronic assembly line.

BACKGROUND ART

In the past, electronic devices were supplied by a microdevice feeder to a robotic feeding system, which removed the electronic microdevices and placed them on printed circuit boards moving through an electronic assembly line. The microdevice feeders were generally aligned on a table underneath the robotic handling system and held in place in part by the weight of the microdevice feeder. Sometimes, the microdevice feeder had additional legs, which helped support its full weight.

The microdevice feeders were generally not held down so as to permit easy removal and replacement of the microdevice feeders. Also to allow easy removal and replacement, electrical cables and/or pneumatic tubes for supplying power were connectable to the microdevice feeder on the portion away from where the weight of the microdevice feeder was primarily supported and also away from the robotic handling system. This meant that the weight support acted as a fulcrum between the connections and the robotic handling system.

The above arrangement was prone to accidents. For example, when an operator was in a hurry to remove the microdevice feeder from the table, the operator would pull the cable and/or tubing downward to pull the connections loose. This would cause a tipping of the microdevice feeder with the connection end in back going down and the portion under the robotic handling system in front going up to crash into the pick-and-place head of the robotic handling system. A pick-and-place head generally costs between forty to fifty times the cost of a microdevice feeder, and this accident would typically destroy the pick-and-place head completely. Further, this would often disable the entire electronic assembly line with a resulting costly loss of production.

A number of different approaches have been taken to try to solve this problem. For example, the table/microdevice feeder system was often redesigned to provide a clamping/latching mechanism. The prior art clamping/latching mechanism often included a spring-loaded finger mounted to an underside of the microdevice feeder. An operator would move the spring-loaded finger back and forth by pressing and releasing, respectively, a lever on the microdevice feeder. To secure the microdevice feeder on the table, the operator would first insert the microdevice feeder into a slot formed on the table. Next, the operator would push the microdevice feeder forward with the lever unlocked in the open position and then release the lever to lock it into position. The spring-loaded finger would come backwards and push against a pin located on the table. The microdevice feeder would be pushed forward and would not be able to back out of the table. To remove the microdevice feeder, the operator would press the lever to release the spring-loaded finger and at the same time move the microdevice feeder away from the table.

There are a number of drawbacks associated with this approach. First, the operation of a clamping/latching mechanism using a spring-loaded finger complicated the installation process because it interfered with free removal and replacement of the microdevice feeder due to space limitations in the microdevice feeder and table area.

Second, the spring used in the spring-loaded finger is typically not strong enough to securely hold the microdevice feeder on the table, especially when the microdevice feeder is heavy. The spring has to be weak enough so that an operator can operate it by pushing or releasing the lever. The levering mechanism undesirably increases the size of the microdevice feeder.

Another approach has been to add additional legs with adjustable feet that would provide additional support for the weight of the microdevice feeder closer to the cable and/or tube connections. Unfortunately, even with this approach it is possible for an operator in a hurry to still tip the microdevice feeder on the table.

A further approach has been to put a cover plate over all the microdevice feeders to act as a holddown to prevent the microdevice feeders from tipping. The drawback is that a single microdevice feeder cannot be removed independently, and the robotic handling system and the production assembly line also have to be stopped in order to remove a single microdevice feeder.

Thus, those skilled in the art have long sought a connection system, which would allow fast replacement of the microdevice feeders on an individual basis without the possibility of damaging the robotic handling system. Previous systems by those skilled in the art have been unsuccessful in providing a fully adequate solution.

DISCLOSURE OF THE INVENTION

The present invention provides a holding connector system for connecting a first structure to a second structure having a latch stop pin and an alignment slot. A connector body having a guide rail, which is pivotally mounted to the first structure, engages the alignment slot for connecting the first structure and the second structure. A holding mechanism having a latch, which is pivotally mounted to the first structure, engages the latch stop pin for holding the first structure to the second structure. Thus, the holding connector system allows for simple, easy installation and removal of the first structure.

The present invention further provides a holding connector system for connecting a microdevice feeder to an assembly line table having a plurality of latch stop pins and a plurality of alignment slots. A connector body having a guide rail, which is pivotally mounted to the first structure, engages one of the plurality of alignment slots for connecting the microdevice feeder and the assembly line table. A holding mechanism having a latch, which is pivotally mounted to the microdevice feeder engages one of the plurality of latch stop pins for holding the microdevice feeder to the assembly line table. Thus, the holding connector system allows for simple, easy installation and removal of the microdevice feeder without the possibility of tipping.

The present invention still further provides a method of connecting a first structure to a second structure using a holding connector system. The second structure has a latch stop pin and an alignment slot. The method includes the steps of: (a) connecting the first structure and the second structure by engaging a guide rail of a connector body of the holding connector system with the alignment slot, the guide rail being pivotally mounted to the first structure by a rail pivot pin; and (2) holding the first structure to the second structure by engaging a latch of a holding mechanism of the holding connector system with the latch stop pin. Thus, the method allows for simple, easy installation and removal of the first structure.

The present invention still further provides a method of connecting a microdevice feeder to an assembly line table using a holding connector system. The assembly line table having a plurality of latch stop pins and a plurality of alignment slots. The method includes the steps of: (a) connecting the microdevice feeder and the assembly line table by engaging a guide rail of a connector body of the holding connector system with one of the plurality of alignment slots, the guide rail being pivotally mounted to the microdevice feeder by a rail pivot pin; and (2) holding the microdevice feeder to the assembly line table by engaging a latch of a holding mechanism of the holding connector system with one of the plurality of latch stop pins. Thus, the method allows for simple, easy installation and removal of the microdevice feeder without the possibility of tipping.

The above and additional advantages of the present invention will become apparent to those skilled in the art from a reading of the following detailed description when taken in conjunction with the accompanying drawings.

BEST MODE FOR CARRYING OUT THE INVENTION

Structure

Figure 1:
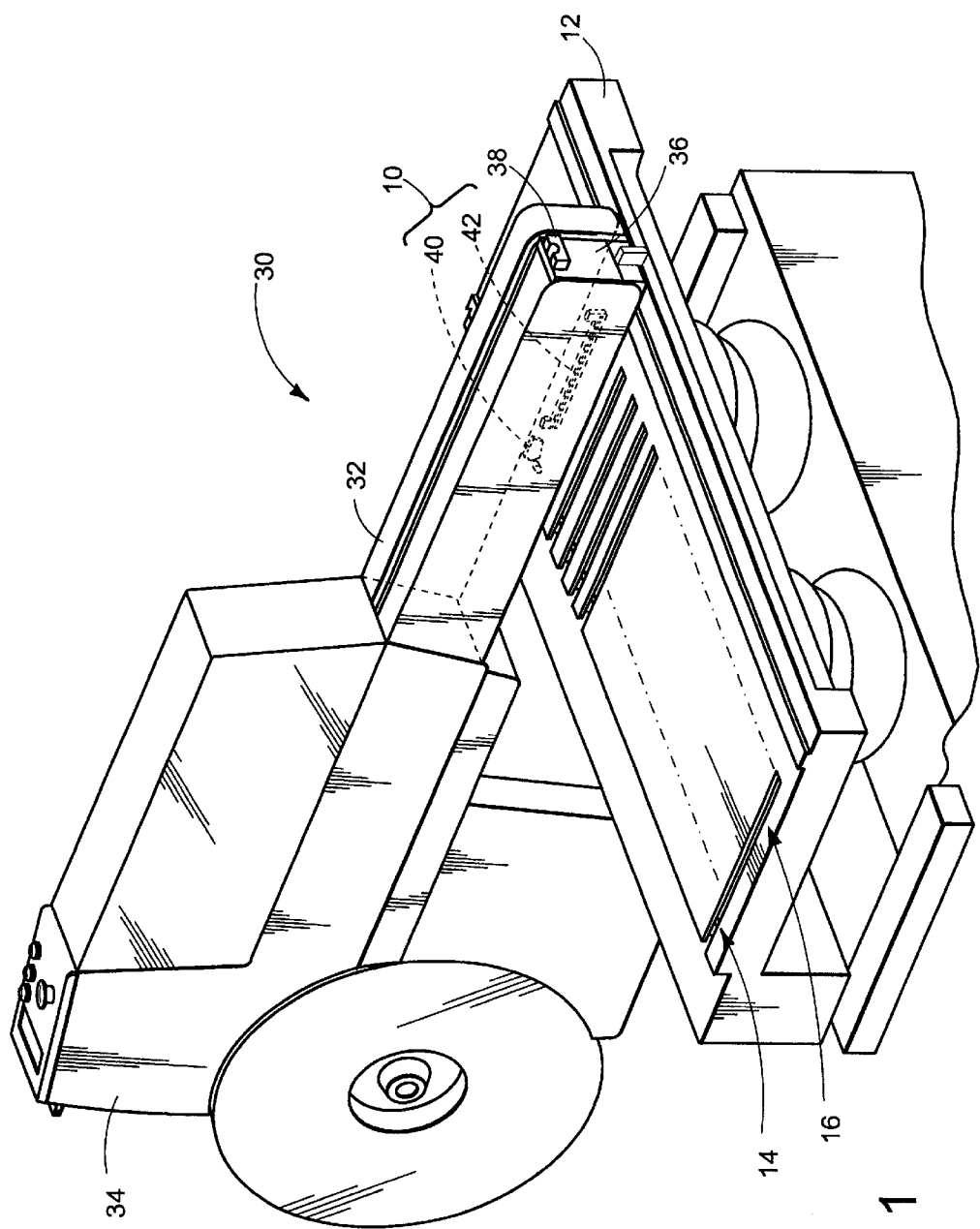
FIG. 1 is an isometric view of the present invention in its operating environment.

Referring now to FIG. 1, therein is shown an isometric view of a microdevice feeder to assembly line holding connector system 10 of the present invention in its operative environment. A conventional assembly line table 12 for an electronic assembly line 13 (shown in FIG. 3 has a plurality of spaced apart alignment slots 16). The alignment slots 16 extend partially from the front of the assembly line table 12 to the back. The assembly line table 12 also has a plurality of latch stop pins 14 positioned in the alignment slots 16 parallel to the width and top of the assembly line table 12.

A microdevice feeder 30 is shown positioned over the assembly line table 12 with its main length substantially parallel to the alignment slots 16. The microdevice feeder 30 has a front portion 32 and a rear portion 34. The front portion 32 has a front plate 36, which is mounted to an upper portion of the front portion 32 and carries a front-top alignment guide 38.

The holding connector system 10 has a latch 40 mounted to an underside of the microdevice feeder 30 and a guide rail 42, which are both pivotally mounted to the underside of the microdevice feeder 30. The latch 40 engages with one of the latch stop pins 14. The guide rail 42 has a train rail cross-section across its width and engages with an inverted Tee cross-section which makes up one of the alignment slots 16 in the assembly line table 12. The guide rail 42 restricts vertical and lateral movement of the microdevice feeder 30.

Figure 2:
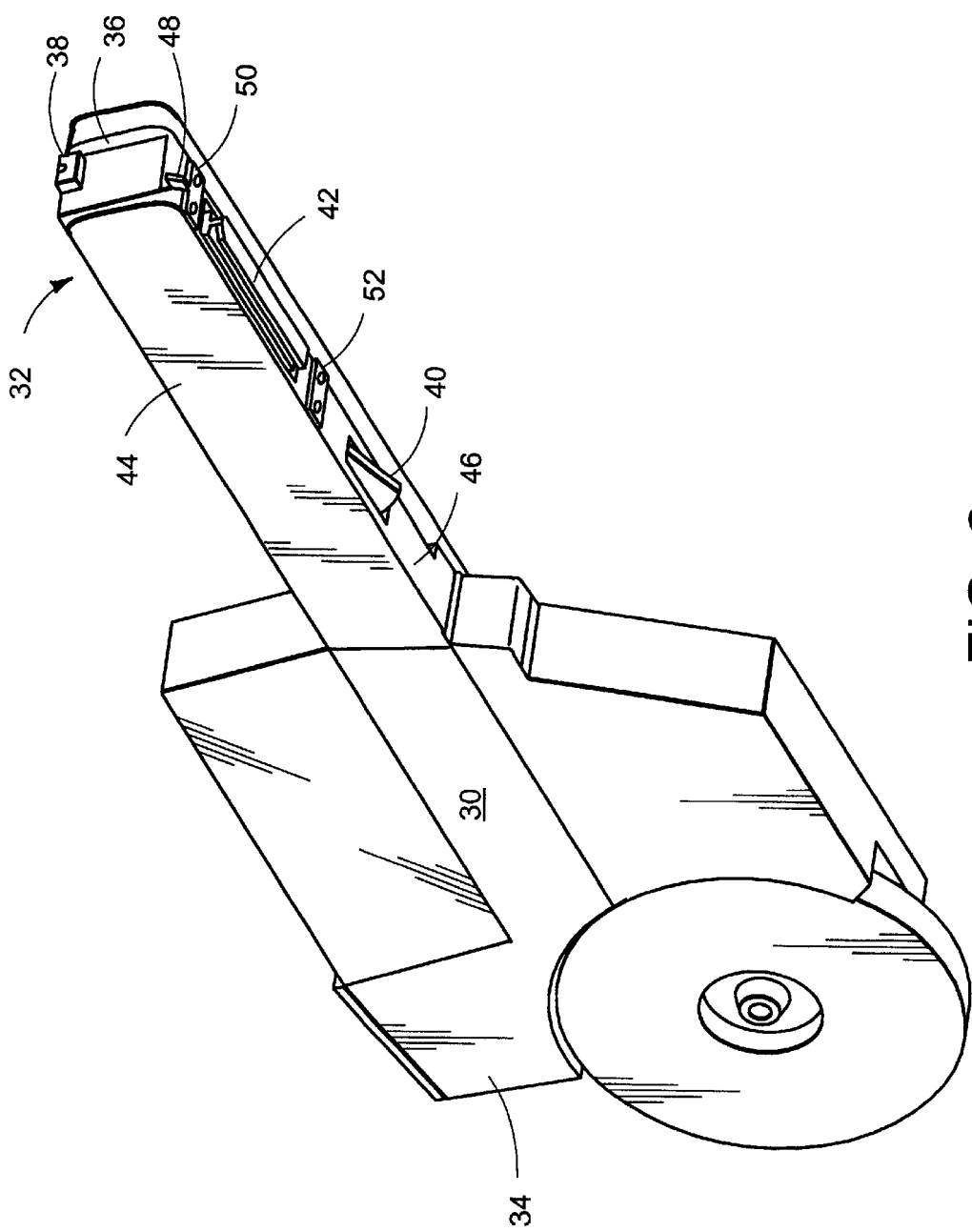
FIG. 2 is an underside isometric view of the present invention.

Referring now to FIG. 2, therein is shown an underside isometric view showing the microdevice feeder to assembly line holding connector system 10 of the present invention.

The microdevice feeder 30 has an adapter cover 44 and an adapter housing 46. An adapter protrusion 48 is integral to a front support 50. The front support 50 and a rear support 52 are secured to the bottom of the adapter housing 46. Also shown are the front plate 36 with the front-top alignment guide 38 and the latch 40.

Figure 3:
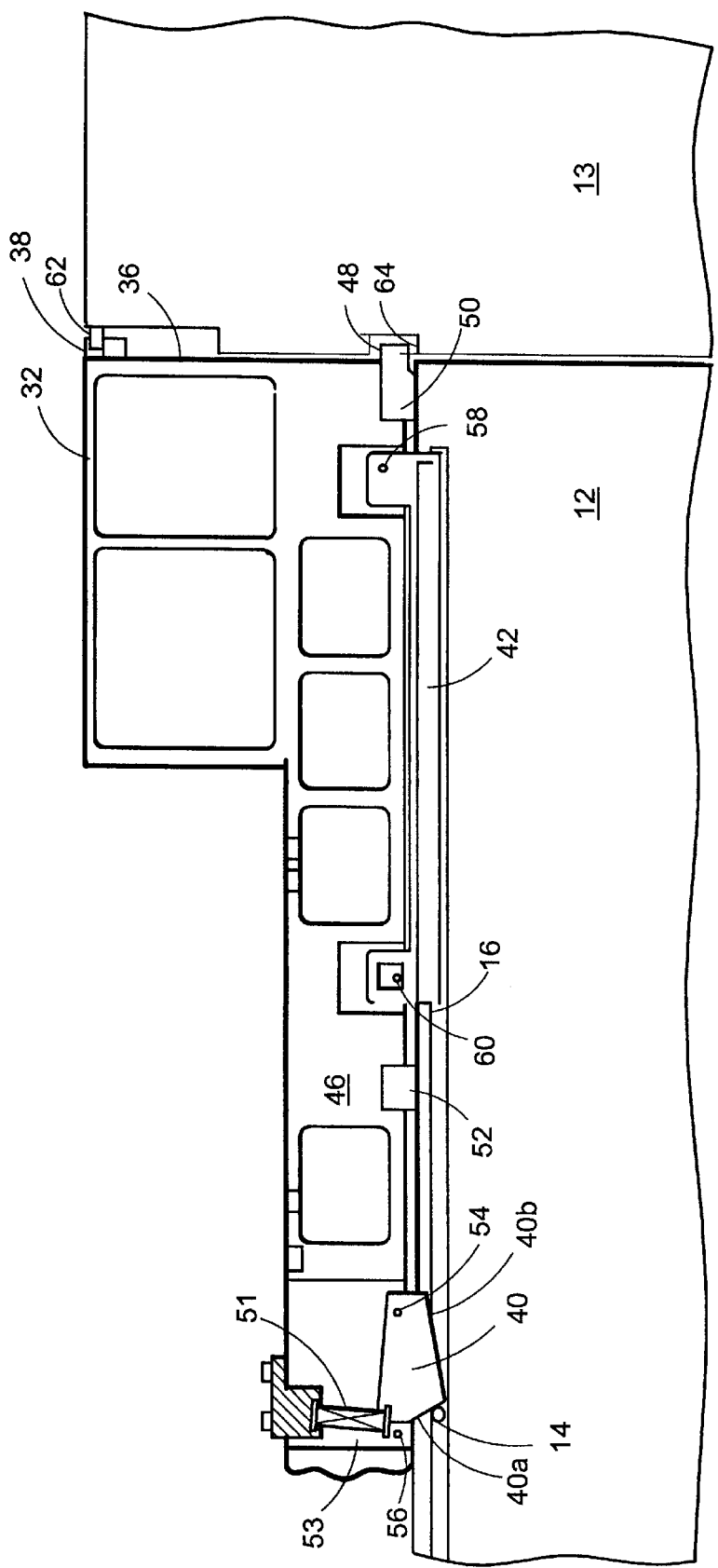
FIG. 3 is a cross-sectional view of the structures of FIG. 1.

Referring now to FIG. 3, therein is shown a cross-sectional view of the structures of FIG. 1. Only a portion of the front portion 32 and the assembly line table 12 are shown, and the latch 40 is not shown in cross-section.

The latch 40 has locking surface 40a and a sliding surface 40b. The latch 40 also has a latch spring 51 inside a latch spring opening 53 formed within the adapter housing 46. The latch 40 is pivotally mounted to the adapter housing 46 via a latch pivot pin 54. A latch limiting pin 56, which is mounted to the adapter housing 46, limits the pivotal motion of the latch 40.

The guide rail 42 is pivotally mounted to the microdevice feeder 30 via a rail pivot pin 58. The pivoting motion of the guide rail 42 is limited by a rail position limiting pin 60, which is mounted to the adapter housing 46.

The assembly line table 12 has a front-top guide pin 62 for engagement with the front-top alignment guide 38 to provide lateral alignment. The assembly line table 12 also has a lower slot 64, which engages the adapter protrusion 48, and with the front-top guide pin 62 provides vertical alignment. The front support 50 and the rear support 52 are shown supporting the microdevice feeder 30 on the assembly line table 12.

Operation

An operator determines the location for the microdevice feeder 30 and selects an alignment slot where the microdevice feeder 30 will go. The operator then engages the guide rail 42 with the selected alignment slot 16. The guide rail 42 will hang down on the top of the rail position limiting pin 60 so the guide rail 42 will be easier to position in the alignment slot 16.

The microdevice feeder 30 will be pushed forward so that the guide rail 42 moves along the alignment slot 16 with the guide rail 42 pivoting about the rail pivot pin 58 until the sliding surface 40b of the latch 40 contacts the latch stop pin 14. As the microdevice feeder 30 continues to move forward, the latch stop pin 14 compresses the latch spring 51 to the point where the latch 40 rides over the latch stop pin 14. At this point, the locking surface 40a of the latch 40 moves down and locks the microdevice feeder 30 in place against the latch stop pin 14. The engagement of the locking surface 40a of the latch 40 and the latch stop pin 14 prevents the microdevice feeder 30 from backing up.

As the microdevice feeder 30 is moved forward further for a short distance, e.g., .125 inch, the front-top alignment guide 38 and the adapter protrusion 48 respectively engage with the front-top guide pin 62 and the lower slot 64. These engagements prevent rocking of the microdevice feeder 30 from side to side and also limit the upper rotation of the microdevice feeder 30. The guide rail 42 provides lengthwise alignment.

The operator then releases the microdevice feeder 30. The microdevice feeder 30 is now securely connected to the assembly line table 12 and rests on the assembly line table 12 under its own weight on the front support 50 and the rear support 52. The microdevice feeder 30 is also aligned with the electronic assembly line 13 by virtue of the engagement with the front-top guide pin 62 and the lower slot 64.

To remove the micro device feeder 30 from the assembly line table 12, the operator lifts the micro device feeder 30 by its rear portion 34. The micro device feeder 30 is lifted up for about an inch, which causes the guide rail 42 to pivot about the rail pivot pin 58. The rail limiting pin is positioned such that it allows the guide rail 42 to pivot to permit the micro device feeder 30 to be lifted up for a predetermined distance, such as for about one inch. The lifting of the micro device feeder 30 by about an inch causes the latch 40 to disengage from the latch stop pin 14. Once the latch 40 is disengaged, the operator pulls the micro device feeder 30 back. The front-top alignment guide 38 and the adapter protrusion 48 then disengeage from the front-top guide pin 62 and the lower slot 64, respectively.

The operator continues to pull back the microdevice feeder 30 until the guide rail 42 is completely disengaged from the alignment slot 16. The microdevice feeder 30 is now free to be removed from the assembly line table 12.

Thus, the holding connector system of the present invention allows for simple, easy installation and removal of the microdevice feeder with precision vertical and horizontal alignment without the possibility of lateral tipping. Furthermore, since the latch of the present invention can be disengaged from the latch stop pin by lifting up the microdevice feeder from the assembly line table, a strong latch pivot spring may be used to firmly secure the microdevice feeder to the assembly line table without the need for a complicated and undesirable levering mechanism.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A holding connector system for connecting a first structure to a second structure having a latch stop and an alignment slot, comprising:
    a guide rail pivotally mounted to the first structure and adapted to engage the alignment slot for aligning the first structure and the second structure; and
    a holding mechanism having a latch, the latch being pivotally mounted to the first structure and adapted to engage the latch stop for cooperating with the guide rail to connect the first structure to the second structure and the latch includes portions operative with the latch stop for pivoting the latch while connecting the first and second structures, for locking the first structure to the second structure during connection, and for disconnecting the first structure from said second structure without pivoting the latch.

2. The holding connector system as claimed in claim 1 wherein:
    the first structure includes mechanisms for limiting pivoting of the guide rail and the latch.

3. The holding connector system as claimed in claim 1 wherein:
    the holding mechanism includes:
        a biasing mechanism for holding the latch engaged with the latch stop.

4. The holding connector system as claimed in claim 3 wherein:
    the first structure is movable relative to the second structure to allow the latch to disengage from the latch stop without movement and with pivoting of the guide rail.

5. The holding connector system as claimed in claim 1 wherein:
    the first and second structures have mutually engageable alignment members to fix alignment therebetween and prevent vertical and lateral movement therebetween.

6. A holding connector system for connecting a micro device feeder to an assembly line table having a plurality of latch stop pins and a plurality of alignment slots, comprising:
    a guide rail pivotally mounted relative to the micro device feeder and adapted to engage one of the plurality of alignment slots for connecting the micro device feeder and the assembly line table;
    a holding mechanism having a latch, the latch being pivotally mounted relative to the micro device feeder and adapted to engage one of the plurality of latch stop pins for holding the micro device feeder to the assembly line table, the holding mechanism having a latch spring positioned within the micro device feeder, the latch spring having a first end and a second end, the first end of the latch spring coupled to the micro device feeder, the second end of the latch spring coupled to the latch the latch spring adapted to extend and push against a first end of the latch, and
    a latch limiting pin mounted on the micro device feeder, the latch limiting pin adapted to limit extension of the latch spring.

7. The holding connector system as claimed in claim 6 wherein:
    the micro device feeder has a rail position limiting pin mounted thereon; and
    the guide rail has a first end and a second end, the first end of the guide rail being pivotally mounted on the micro device feeder, the rail position limiting pin engages the second end of the guide rail and limits pivoting movement of the second end of the guide rail.

8. The holding connector system as claimed in claim 6 wherein:
    the guide rail is pivotally mounted to have pivoting movement of an end of the guide rail for a distance for the latch to clear one of the plurality of latch stop pins.

9. The holding connector system as claimed in claim 6 wherein:
    the assembly line table has a plurality of lower slots; and
    the micro device feeder has a front support which is engageable with one of the plurality of lower slots to prevent a sideways movement of the micro device feeder with respect to the assembly line table.

10. The holding connector system as claimed in claim 6 wherein:
    the assembly line table has a plurality of alignment pins; and
    the micro device feeder has a front-top alignment guide engageable with one of the plurality of the alignment pins to prevent a rotational movement of the micro device feeder with respect to the assembly line table.

11. A holding connector system for connecting a micro device feeder to an assembly line table having a plurality of latch stop pins and a plurality of alignment slots, comprising:
    a guide rail pivotally mounted to the micro device feeder and adapted to engage one of the plurality of alignment slots for connecting the micro device feeder and the assembly line table, the micro device feeder has a rail position limiting pin mounted on the micro device feeder, the guide rail has a first end and a second end, the first end of the guide rail being pivotally mounted to the micro device feeder, the rail position limiting pin engages the second end of the guide rail and for limiting pivoting movement of the second end of the guide rail;

a holding mechanism including:

a latch pivotally mounted to the micro device feeder and adapted to engage one of the plurality of latch stop pins for holding the micro device feeder to the assembly line table, and a latch spring positioned within the micro device feeder, the latch spring having a first end and a second end, the first end of the latch spring coupled to the micro device feeder, the second end of the latch spring coupled to the latch, the latch spring adapted to extend and push against a first end of the latch, and a latch limiting pin mounted on the micro device feeder, the latch limiting pin adapted to limit an extension of the latch spring, wherein the pivoting movement of the second end of the guide rail allows the latch to clear one of the plurality of latch stop pins.

* * * * *